(12) United States Patent
Murata et al.

(10) Patent No.: US 12,062,552 B2
(45) Date of Patent: Aug. 13, 2024

(54) MANUFACTURING METHOD OF SEMICONDUCTOR DEVICE

(71) Applicant: Fuji Electric Co., Ltd., Kanagawa (JP)

(72) Inventors: Yuma Murata, Nagano (JP); Ryoichi Kato, Nagano (JP); Takashi Saito, Nagano (JP); Ryotaro Tsuruoka, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 107 days.

(21) Appl. No.: 17/516,545

(22) Filed: Nov. 1, 2021

(65) Prior Publication Data

US 2022/0157623 A1 May 19, 2022

(30) Foreign Application Priority Data

Nov. 17, 2020 (JP) ................. 2020-191001

(51) Int. Cl.
*H01L 21/56* (2006.01)
*H01L 21/66* (2006.01)

(52) U.S. Cl.
CPC .............. *H01L 21/56* (2013.01); *H01L 22/12* (2013.01)

(58) Field of Classification Search
None
See application file for complete search history.

(56) References Cited

U.S. PATENT DOCUMENTS

2022/0157623 A1* 5/2022 Murata ............... H01L 23/3735

FOREIGN PATENT DOCUMENTS

JP 2012-4468 A 1/2012

* cited by examiner

*Primary Examiner* — Jack S Chen
(74) *Attorney, Agent, or Firm* — CHEN YOSHIMURA LLP

(57) ABSTRACT

A method for manufacturing a semiconductor device includes obtaining a shear stress $F_T$ at which that a value obtained by dividing a loss elastic modulus by a storage elastic modulus equals 1 for each of a plurality of candidate heat conductive greases at each of a plurality of temperatures that are within a prescribed control temperature range determined based on an operation temperature range of the semiconductor device to be manufactured; selecting a heat conductive grease, among the plurality of candidate heat conductive greases, that has a value of $F_T$ of 100 Pa or more and 200 Pa or less at each of the plurality of the temperatures within the prescribed control temperature range; and attaching a resin sealed body that includes a semiconductor element mounted on a laminated substrate therein to a cooler via the heat conductive grease that has been selected in the selecting.

5 Claims, 11 Drawing Sheets

MANUFACTURING METHOD OF SEMICONDUCTOR DEVICE

BACKGROUND OF THE INVENTION

Technical Field

The present invention relates to a method for manufacturing a semiconductor device. More specifically, the present invention relates to a method for manufacturing a semiconductor device having an excellent effect of suppressing pump-out of heat conductive grease and having high long-term reliability.

Background Art

Power modules used for power control switching applications generally have a structure in which semiconductor elements wired with metal wires, lead frames, and metal pins are soldered onto a laminated substrate, and these are sealed with a resin. A cooler is attached to such a power module in order to cool the heat generated by the semiconductor element. Normally, the contact surface between the power module and the cooler has irregularities due to surface roughness, so that an air layer having low thermal conductivity is formed. Therefore, for the purpose of improving heat dissipation on the contact surface, heat conductive grease, which is a viscoelastic body having high heat conductivity, is applied between the power module and the cooler.

When the heat conductive grease is applied to the power module, the power module is warped and deformed due to the heat generated by the semiconductor element, and there occurs a pump-out phenomena in which the heat conductive grease is pushed out of the power module due to mechanical factors. As a result, the thermal resistance of the power module may increase. Further, during high-temperature operation of the power module, the thermal resistance of the power module may increase due to oil seepage, oil volatilization, oil oxidative deterioration, etc., which are chemical factors of the heat conductive grease.

As a method for evaluating the reliability of the heat conductive grease, a ΔTj power cycle or a ΔTc power cycle test has generally been carried out. However, these test methods require a very long test time. Therefore, as a simpler alternative method, an evaluation method for discriminating a heat conductive grease having a high pump-out suppressing effect has been proposed (see, for example, Patent Document 1). Patent Document 1 discloses a method for evaluating a heat conductive grease by obtaining a yield value from the y-axis intercept of a straight line in which the square root of a shear stress and the square root of a shear velocity are plotted based on the Casson equation.

RELATED ART DOCUMENT

Patent Document

Patent Document 1: Japanese Patent Application Laid-Open Publication No. 2012-4468

SUMMARY OF THE INVENTION

However, the method proposed in Patent Document 1 merely evaluates the yield value of the heat conductive grease at 20° C., and is not a sufficient evaluation for the actual operating temperature range of the power module. On the other hand, it took a lot of time to evaluate by performing a power cycle test simulating actual operation.

In view of the above problems, an object of the present invention is to provide a method for easily identifying and selecting a highly reliable heat conductive grease having a high pump-out suppressing effect, and a method for using the selected heat conductive grease to obtain a highly reliable semiconductor device.

As a result of diligent studies, the present inventors came up with the idea of obtaining the pump-out characteristics of a heat conductive grease by evaluating the shear stress value when the storage elastic modulus and the loss elastic modulus of the heat conductive grease are equal in the controlled temperature range of the semiconductor device, thereby devising the present invention.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method for manufacturing a semiconductor device that includes obtaining a shear stress $F_T$ at which that a value obtained by dividing a loss elastic modulus by a storage elastic modulus equals 1 for each of a plurality of candidate heat conductive greases at each of a plurality of temperatures that are within a prescribed control temperature range determined based on an operation temperature range of the semiconductor device to be manufactured; selecting a heat conductive grease, among the plurality of candidate heat conductive greases, that has a value of $F_T$ of 100 Pa or more and 200 Pa or less at each of the plurality of the temperatures within the prescribed control temperature range; and attaching a resin sealed body that includes a semiconductor element mounted on a laminated substrate therein to a cooler via the heat conductive grease that has been selected in the selecting.

In the method for manufacturing a semiconductor device, the controlled temperature range is preferably 25° C. to 175° C.

In the method for manufacturing a semiconductor device, it is preferable that the obtaining the shear stress $F_T$ includes measuring the storage elastic modulus and the loss elastic modulus of the candidate heat conductive greases.

In the method for manufacturing a semiconductor device, it is preferable that the measurement of the storage elastic modulus and the loss elastic modulus is performed by vibration rheometer measurement.

In the method for manufacturing a semiconductor device, it is preferable that the resin sealed body has a longitudinal dimension/lateral dimension value of 1.5 or more.

In the method for manufacturing a semiconductor device, it is preferable that the semiconductor element is made of Si or SiC.

According to the present invention, it is possible to evaluate the pump-out characteristics when the heat conductive grease is applied to an actual device, and it is possible to realize an efficient semiconductor device manufacturing method in which the development time required for studying the application of the heat conductive grease is reduced.

It is to be understood that both the foregoing general description and the following detailed description are exemplary and explanatory, and are intended to provide further explanation of the invention as claimed.

DETAILED DESCRIPTION OF EMBODIMENTS

Hereinafter, embodiments of the present invention will be described with reference to the drawings. However, the present invention is not limited to the embodiments described below.

One embodiment of the present invention relates to a method for manufacturing a semiconductor device. The method for manufacturing a semiconductor device according to the present embodiment includes the following steps.

(1) A step of obtaining a shear stress $F_T$ such that the loss elastic modulus/storage elastic modulus=1 at plural temperatures T for each of the candidate heat conductive greases.

(2) A step of selecting a heat conductive grease having an $F_T$ of 100 Pa or more and 200 Pa or less within a prescribed control temperature range of the semiconductor device.

(3) A step of attaching a resin sealed body containing a semiconductor element mounted on a laminated substrate to a cooler via the heat conductive grease that has been selected in the selection step.

The semiconductor device manufactured by the above manufacturing method will be described. The semiconductor device is, for example, a device in which a resin sealed body including a semiconductor element mounted on a laminated substrate is attached to a cooler via a prescribed heat conductive grease that has been selected.

Figure 1:
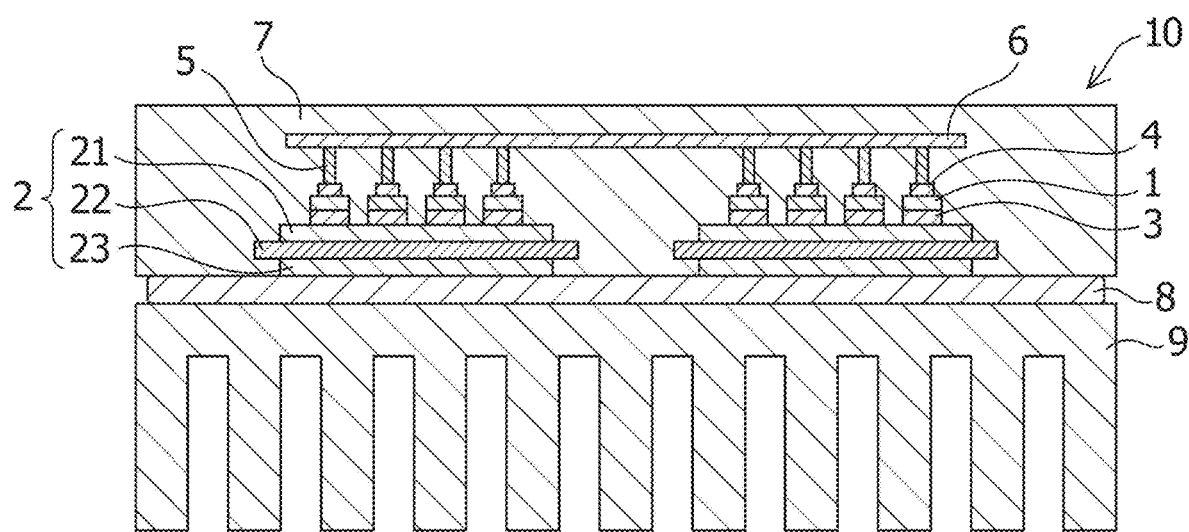
FIG. 1 is a cross-sectional view schematically showing a configuration of a power module according to an embodiment of the present invention.

FIG. 1 is a schematic cross-sectional view of a power module, which is an example of the semiconductor device manufactured by the manufacturing method according to the present embodiment. In the power module shown in the figure, the resin sealed body 10 is arranged on the cooler 9 via the heat conductive grease 8. The resin sealed body 10 includes semiconductor elements 1 bonded by the solder bonding layers 3 on respective laminated substrates 2, the implant pins 5 bonded to the semiconductor elements 1 by the solder bonding layers 4, and a wiring board 6 connected to the implant pins 5, all of which are sealed with a sealing resin 7.

As the semiconductor element 1, a power chip such as an IGBT (Insulated Gate Bipolar Transistor) or a diode chip, and various Si devices, SiC devices, GaN devices and the like can be used. Moreover, these devices may be used in combination. For example, a hybrid module using a Si-IGBT and a SiC-SBD may be used. The number of semiconductor elements mounted on each laminated substrate may be one, or a plurality of semiconductor elements may be mounted thereon.

The laminated substrate 2 can be composed of an insulating substrate 22, a first conductive plate 21 formed on one of the main surfaces thereof, and a second conductive plate 23 formed on the other main surface. As the insulating substrate 22, a material having excellent electrical insulation and thermal conductivity can be used. Examples of the material of the insulating substrate 22 include $Al_2O_3$, AlN, SiN and the like. Particularly in high withstand voltage applications, a material having both excellent electrical insulation and high thermal conductivity is preferable, and AN and SiN can be used, but the material is not limited thereto. As the first conductive plate 21 and the second conductive plate 23, metal materials such as Cu and Al having excellent workability can be used. Among such conductive plates made of Cu or the like, the second conductive plate 23 that is not in contact with the semiconductor element 1 may be referred to as a back surface copper foil or a back surface conductive plate. Further, the first conductive plate 21 and the second conductive plate 23 may be Cu or Al that has been subjected to a treatment such as Ni plating for the purpose of preventing rust. Examples of the method for arranging the first conductive plate 21 and the second conductive plate 23 on the insulating substrate 22 include a direct bonding method (Direct Copper Bonding method) and a brazing material bonding method (Active Metal Blazing method). As a modification of the laminated substrate, although not shown, two first conductive plates may be separately provided on an insulating substrate, one of which is an electrode bonded to a semiconductor element and the other of which is an electrode connected to a conductive connecting member, such as a lead frame.

The solder bonding layers 3 and 4 can be formed by using lead-free solder. For example, Sn—Ag—Cu type, Sn—Sb type, Sn—Sb—Ag type, Sn—Cu type, Sn—Sb—Ag—Cu type, Sn—Cu—Ni type, Sn—Ag type solder alloy and the like may be used, but the bonding layer solder is not limited to these. It is also possible to form a bonding layer using a connecting material containing fine metal particles such as a sintered body of nano-silver particles.

As the wiring board 6, a polyimide film substrate or an epoxy film substrate on which a conductive layer such as Cu or Al is formed can be used. As the implant pin 5, a copper pin using copper can be used. The conductive layer of the wiring board 6 and the implant pin 5 may be made of Cu or Al that has been subjected to a treatment such as Ni plating for the purpose of preventing rust.

The heat conductive grease 8 is applied in a layered manner between the resin sealed body 10 and the cooler 9. In particular, the heat conductive grease 8 comes into contact with the second conductive plate 23 exposed from the resin sealed body 10 and transfers the heat generated by the semiconductor element 1 to the cooler 9. The manufacturing method of the present invention includes, in one aspect, a step of selecting a heat conductive grease 8 having specific physical properties in a specific temperature range. Details will be described later.

As the cooler 9, a metal such as copper or aluminum having excellent thermal conductivity is used. Further, in order to prevent corrosion, the cooler 9 can be coated with Ni and a Ni alloy. The cooler 9 may have a plate shape or may have cooling fins. Further, the cooler 9 may be a water-cooled cooler configured so that a refrigerant such as water passes through the inside thereof. It is preferable that the surface of the cooler 9 facing the back surface of the resin sealed body 10 via the heat conductive grease (upper surface of the cooler 9) is flat.

The sealing resin 7 may be any resin that is generally used as a resin for insulating and sealing a semiconductor device, and is not particularly limited. The sealing resin 7 may include a thermosetting resin main agent and an inorganic filler, and may further contain, selectively as needed, a curing agent, a curing accelerator, and an additive.

The thermosetting resin main agent is not particularly limited, and examples thereof include an epoxy resin, a phenol resin, and a maleimide resin. Of these, an epoxy resin having at least two or more epoxy groups in one molecule is particularly preferable because it has high dimensional stability, high water resistance, high chemical resistance, and high electrical insulation. Specifically, it is preferable to use an aliphatic epoxy resin, an alicyclic epoxy resin, or a mixture thereof.

The aliphatic epoxy resin refers to an epoxy compound in which the carbon to which the epoxy group is directly bonded is the carbon constituting the aliphatic hydrocarbon. Therefore, even compounds containing an aromatic ring in the main skeleton that satisfy the above condition are classified as aliphatic epoxy resins. Aliphatic epoxy resins can be used alone or in admixture of two or more. Further, since the naphthalene type epoxy resin and the trifunctional or higher functional polyfunctional type epoxy resin have a high glass transition temperature, the heat resistance can be improved by including these epoxy resins.

The alicyclic epoxy resin refers to an epoxy compound in which two carbon atoms constituting an epoxy group constitute an alicyclic compound. Examples of the alicyclic epoxy resin include, but are not limited to, a monofunctional epoxy resin, a bifunctional epoxy resin, and a trifunctional or higher polyfunctional epoxy resin. The alicyclic epoxy resin can also be used alone or in combination of two or more different alicyclic epoxy resins. When the alicyclic group epoxy resin is mixed with an acid anhydride curing agent and cured, the glass transition temperature rises. Therefore, if the alicyclic group epoxy resin is mixed with the alicyclic group epoxy resin and cured, the heat resistance can be increased. The thermosetting resin main agent may be a mixture of the above-mentioned aliphatic epoxy resin and alicyclic epoxy resin, and the mixing ratio may be appropriately determined.

The inorganic filler may be a metal oxide or a metal nitride, for example, molten silica, silica (silicon oxide), alumina, aluminum hydroxide, titania, zirconia, aluminum nitride, talc, clay, mica, glass fiber and the like, but is not limited to these. The inorganic filler may be used alone or in combination of two or more. Further, these inorganic fillers may be microfillers or nanofillers, and two or more kinds of inorganic fillers having different particle sizes and/or types may be mixed and used.

The thermosetting resin composition according to the present embodiment may contain a curing agent as an optional component. The curing agent is not particularly limited as long as it can react with a thermosetting resin main agent, preferably an epoxy resin main agent and can be cured, but it is preferable to use an acid anhydride-based curing agent, such as an aromatic acid anhydride, cyclic aliphatic acid anhydride, aliphatic acid anhydride and the like. The blending amount of the curing agent is preferably 50 parts by mass or more and about 170 parts by mass or less with respect to 100 parts by mass of the epoxy resin main agent, and more preferably, 80 parts by mass or more and about 150 parts by mass or less with respect to 100 parts by mass of the epoxy resin main agent.

A curing accelerator can be further added to the thermosetting resin composition as an optional component. As the curing accelerator, imidazole or a derivative thereof, a tertiary amine, a boric acid ester, a Lewis acid, an organometallic compound, an organometallic salt and the like can be appropriately blended. The amount of the curing accelerator added is preferably 0.01 parts by mass or more and 50 parts by mass or less with respect to 100 parts by mass of the thermosetting resin main agent, and more preferably, 0.1 parts by mass or more and 20 parts by mass with respect to 100 parts by mass of the thermosetting resin main agent.

The thermosetting resin composition may also contain an optional additive as long as it does not impair its properties. Examples of the additive include, but are not limited to, a flame retardant, a pigment for coloring a resin, a plasticizer for improving crack resistance, and a silicone elastomer. These optional components and their addition amounts can be appropriately determined by those skilled in the art according to the specifications required for the semiconductor device and/or the sealed body.

The semiconductor device of the present disclosure is not limited to the example and mode that are illustrated in the drawings, and various modified modes are possible. The resin sealed body may have a resin case, and the laminated substrate and the semiconductor element may be resin-sealed in the case. The semiconductor element and the electrodes and lead-out terminals of the laminated substrate may be connected by a lead frame which is a conductive connecting member, and the semiconductor element and the external terminal may be connected by an aluminum wire. The wiring board may be sealed with a sealing resin, or may be provided outside the sealing resin. Further, the sealing resin may have a one-layer structure composed of one kind of composition or a two-layer or more laminated structure composed of two or more kinds of compositions. These modifications (not shown) are also included in the resin sealed body of the present disclosure.

In any of the embodiments, the second conductive plate on the back surface of the laminated substrate and the sealing resin are exposed on the back surface of the resin sealed body. The exposed surface (back surface) of the second conductive plate and the sealing resin surface may be approximately flush with each other, the second conductive plate may protrude from the sealing resin surface, or the sealing resin surface may protrude from the exposed surface of the second conductive plate. An arrangement in which the sealing resin surface protrudes from the back surface of the second conductive plate so as to surround the periphery of the second conductive plate is preferable because the heat conductive grease is difficult to pump out in that case. The amount of protrusion (step) of the sealing resin surface with respect to the back surface of the second conductive plate is preferably 10 to 100 μm. If it protrudes beyond 100 μm, the thermal resistance increases, which is not preferable. Further, the protrusion amount is preferably 10 μm or more in order for the sealing resin surface to protrude downward from the second conductive plate surface even if the second conductive plate is warped due to thermal deformation of the module. Further, since the average particle size of the filler that can be contained in the heat conductive grease is usually about 1 μm to 100 μm, the protrusion amount is preferably 10 μm or more in order to suppress pump-out. When the second conductive plate protrudes from the sealing resin surface, the protrusion amount is preferably 100 μm or less. If the second conductive plate protrudes beyond 100 μm, the heat conductive grease tends to be relatively easily pumped out to the sealing resin surface side, which is not desirable.

Further, the semiconductor device may further include a heat radiating plate bonded to the laminated substrate with a bonding material such as a solder material under the laminated substrate. The heat radiating plate is made of metal or the like and has a role of dissipating heat generated from the semiconductor element. In this way, when the heat radiating plate is exposed on the back surface of the resin sealed body, the heat radiating plate is connected to the cooler via the heat conductive grease. In any aspect of manufacturing the semiconductor device, a step of attaching the resin sealed body to the cooler via the heat conductive grease, which is one step of the present invention described later, is included.

Next, an embodiment of a method for manufacturing a semiconductor device according to the present invention will be described.

(1) Process of Obtaining $F_T$

In the first step, for the candidate heat conductive greases, a shear stress at which the loss elastic modulus/storage elastic modulus=1 at plural temperatures T in a prescribed control temperature range is obtained. In the present specification, the shear stress at which the loss modulus/storage modulus=1 at a temperature T measured for the heat conductive grease is defined as $F_T$.

The heat conductive grease that is a candidate in this step may be a heat conductive grease generally used in a semiconductor device, and may include a grease and a filler. The grease contains, for example, a silicone-based or non-silicone-based base oil, a thickener which is a fibrous structure, and various additives. As the thickener, those containing a metallic soap such as lithium soap, those containing a non-soap component such as bentonite, or either of them may be used. Further, the additive may contain general additives such as an antioxidant, a rust preventive, and a corrosion inhibitor. The filler may be alumina, pure aluminum, zinc oxide or the like having high thermal conductivity. The filler can be added to the heat conductive grease to improve the heat conductivity. The average particle size of the filler may be 1 μm to 100 μm, more preferably 10 μm to 50 μm. Within this range, the $F_T$ can be easily set to a predetermined range. Further, if the particle size is too small, the dispersibility in the grease is poor and the grease is likely to aggregate, and if the particle size is too large, the viscoelasticity of the heat conductive grease may be adversely affected. Further, the particle size of the filler is related to the film thickness of the heat conductive grease, and is preferably smaller than the film thickness of the predetermined heat conductive grease. The preferable film thickness at the time of applying the heat conductive grease will be described later.

The candidate heat conductive grease can be selected from commercially available products, or a composition containing the above-mentioned components can be appropriately prepared, and the selection range of the candidates is not particularly limited. A person skilled in the art can appropriately determine candidate heat conductive greases from the viewpoints of heat resistance, viscosity, thermal conductivity, etc., required at about −40° C. to 175° C., which is an example of the operating temperature range of the semiconductor device. When a commercially available heat conductive grease is used as a candidate, it is not preferable to use a heat conductive grease that has been subjected to operations for adjusting physical properties, such as viscosity, of the commercially available product, by, for example, heating, light irradiation, addition and/or removal of components, etc. This is because if the heat conductive grease after such operation is used in the manufacture of the semiconductor device, the characteristics fluctuate greatly, the process management may be more complex, and the quality of the product may fluctuate.

In the present invention, the prescribed control temperature range of the semiconductor device means, in one example, the temperature range from room temperature to the upper limit of the operating temperature of the semiconductor device, and can be expressed by $t_1 \leq T \leq t_2$ with the lower limit value being $t_1$ and the upper limit value being $t_2$. It is known that in the temperature range lower than room temperature, the influence of temperature on the pump-out characteristics of the heat conductive grease is small. Therefore, if the pump-out characteristic of the heat conductive grease is managed in the temperature range from the room temperature to the upper limit of the operating temperature of the semiconductor device, reliability within the operating temperature range of the semiconductor device can be ensured. The values of the lower limit value $t_1$ and the upper limit value $t_2$ differ depending on the type and application of the semiconductor device to be manufactured, and are not limited to examples described in the present disclosure. Generally, the lower limit value $t_1$ may be room temperature, for example, 20 to 25° C. The upper limit value $t_2$ may be, for example, about 150 to 200° C. As an example, the lower limit value $t_1$ may be 25° C. and the upper limit value $t_2$ may be 175° C.

The storage elastic modulus and the loss elastic modulus are physical property values of the heat conductive grease which is a viscoelastic body, and both are values which can depend on the temperature. The storage elastic modulus is expressed as G' and represents the elasticity (hardness) of the heat conductive grease which is a viscoelastic body. The loss elastic modulus is expressed as G" and represents the viscosity of the heat conductive grease. The loss elastic modulus G"/storage elastic modulus G' obtained in this step is sometimes referred to as tan δ and is also referred to as loss tangent. Tan δ is a parameter representing the contribution of viscosity in a viscoelastic body. In the present specification, the storage elastic modulus at a predetermined temperature T may be referred to as $G'_T$, the loss elastic modulus may be referred to as $G''_T$, and $G''_T/G'_T$ may be referred to as tan $\delta_T$.

Both the storage elastic modulus $G_T'$ and the loss elastic modulus $G_T''$ can be obtained by vibration rheometer measurement at the prescribed temperature T (° C.). The condition of the indentation thickness at the time of measurement can be about 10 times the minimum possible grease coating thickness (Bondo Line Thickness: BLT), and is preferably about 500 μm or more. This is because when the coating thickness is small, noise and error due to the interaction between the filler particles, for example, the influence of collision or contact may occur. The frequency at which distortion is applied is preferably 1 Hz. The indentation thickness at the time of measurement is the film thickness of grease when measured with a vibration rheometer. Further, the shear stress $F_T$ at which tan δ=1 can be obtained by sweeping the shear stress in the vibration rheometer measurement at the prescribed temperature T (° C.). Specifically, in FIGS. 8 to 10 of examples described later, it is the shear stress (horizontal axis) when tan $\delta_T$ on the vertical axis is 1. The shear stress at which tan $\delta_T$=1 represents the stress required to change the heat conductive grease, which is a viscoelastic body, from elastic to viscous at the temperature T.

Since the value of tank depends on the temperature T, tan $\delta_T$ at the temperature T and the shear stress $F_T$ at which tan $\delta_T$=1 are obtained in a temperature range satisfying $t_1 \leq T \leq t_2$. The shear stress $F_T$ is preferably obtained at at least three different temperatures satisfying $t_1 \leq T \leq t_2$. This is because it is preferable to take into consideration the case where elasticity and viscosity do not change monotonically with respect to temperature. Further, in the temperature characteristics of tan δ (FIG. 12) demonstrated in the examples described later, tan δ has a maximum value at 175° C., and it is possible to grasp the behavior by examining at least three points. For example, it is preferable to obtain the shear stress $F_{t1}$ at T=$t_1$, the shear stress $F_{t2}$ at T=$t_2$, and the shear stress $F_{tm}$ at a temperature $t_m$ which is substantially intermediate between $t_1$ and $t_2$. More specifically, when $t_1$ is 25° C. and $t_2$ is 175° C., $t_m$ can be 100 to 125° C., for example, and measurement can be performed at three points of T=25° C., 125° C., and 175° C., for example. Further, the shear stress $F_T$ may be measured at 4 or more points.

(2) Step of Selecting a Heat Conductive Grease

In the second step, a heat conductive grease having an $F_T$ of 100 Pa or more and 200 Pa or less within the prescribed control temperature range of the semiconductor device is selected. In this step, a heat conductive grease that satisfies the condition that the $F_T$ at each of a plurality of measurement temperatures T within the range of $t_1 \leq T \leq t_2$ is within the range of 100 Pa or more and 200 Pa or less is selected. It can be determined that the heat conductive grease satisfying this condition has a pump-out suppressing effect in the predetermined control temperature range of the semiconductor device to be manufactured, $t_1 \leq T \leq t_2$, and such a grease is selected as a member used in manufacturing the semiconductor device in the third step described later.

Here, the pump-out will be described. Pump-out is a phenomenon in which the power module itself, especially the resin sealed body, repeatedly deforms (warps) when it undergoes repeated temperature changes during a power cycle, and because of this, the heat conductive grease is discharged to the outside. By the first step and the second step of the manufacturing method according to the present embodiment, it is possible to select a heat conductive grease that is difficult to pump out. In general, even if the same heat conductive grease is used, depending on the shape of the power module, the larger the warp of the power module, the more likely it is that pump out will occur. Therefore, the selection of the heat conductive grease in the first step and the second step is particularly effective for suppressing the pump-out for a module in which a plurality of semiconductor elements are arranged in the longitudinal direction and the ratio of the longitudinal dimension to the lateral dimension is large. The dimensions in the longitudinal direction and the dimensions in the lateral direction referred to here are the dimensions of the resin sealed body in a cross section parallel to the laminated substrate surface. A large ratio of the longitudinal dimension to the lateral dimension means that, for example, the value of the longitudinal dimension/ the lateral dimension is 1.5 or more. The value of the longitudinal dimension/lateral dimension that is effective in suppressing pump-out may be, for example, about 1.5 to 4, about 2 to 3.5, or about 2.5 to 3. Such a module having a shape in which the ratio of the longitudinal dimension to the lateral dimension is large is, for example, as shown in FIG. 1, a 2in1 type module having a half bridge composed of two laminated substrates in one module. Further, also in the 4in1 type having two sets of 2in1 and the 6in1 type having three sets of 2in1 type, the pump-out can be effectively prevented by selecting the heat conductive grease according to the present aspect of the invention.

The second step may optionally include a step of evaluating the heat resistance of the heat conductive grease in the control temperature range of the semiconductor device and selecting the heat conductive grease accordingly. The heat resistance is evaluated by measuring the 1% weight loss temperature of the oil (i.e., the temperature at which the oil loses its weight by 1%) contained in the heat conductive grease. When the 1% weight loss temperature is higher than the control temperature range defined above, it can be determined that the heat conductive grease has sufficient heat resistance. If the 1% weight loss temperature is within the control temperature range or lower, the oil contained in the heat conductive grease is likely to volatilize, which may reduce the long-term reliability of the semiconductor device.

If the candidate heat conductive grease does not satisfy the $F_T$ condition, it can be determined that the heat conductive grease does not have a sufficient pump-out suppressing effect according to the standard of this step and is not selected as a member of the semiconductor device. Further, optionally, if the candidate heat conductive grease does not satisfy the condition of the 1% weight loss temperature of the oil, it may be judged that the long-term reliability is not sufficient and the candidate is not selected as a member of the semiconductor device.

The first step and the second step can also be said to be methods for evaluating heat conductive greases that can suppress pump-out at the control temperature of the semiconductor device. Therefore, the present invention also relates to a method for evaluating the reliability of a heat conductive grease including the above-mentioned first step and second step.

(3) Installation Process

In the third step, the resin sealed body 10 including the semiconductor elements 1 mounted on the laminated substrates 2 illustrated in FIG. 1 is attached to the cooler 9 via the heat conductive grease 8 that has been selected in the above-described selection step. This step can also be said to be a step of assembling the semiconductor device using the selected heat conductive grease 8. The production of the resin sealed body 10 can be carried out by a usual method suitable for the structure of the sealed body, and is not particularly limited. For example, in the case of manufacturing the illustrated semiconductor device, the laminated substrates 2, the semiconductor elements 1, the implant pins 5, and the wiring board 6 are joined by the solder bonding layers 3 and 4, and placed in an appropriate die. Next, the sealing resin 7 is filled in the die and heat-cured at a heating temperature and heating time conditions suitable for the sealing resin 7 to form a mold. The embodiment is not limited to the illustrated embodiment, and the resin sealed body may be molded so that at least the back surface of the conductive plate is exposed. Examples of the molding method include, but are not limited to, vacuum casting, transfer molding, liquid transfer molding, and potting.

In this way, the resin sealed body 10 is manufactured, the heat conductive grease 8 is applied, and the resin sealed body 10 is combined with the cooler 9 to form a semiconductor device. Specifically, the heat conductive grease is applied to the back surface of the resin sealed body 10, and is placed at a predetermined position of the cooler 9, and the resin sealed body 10 and the cooler 9 are fixed by fastening members such as screws. At this time, it is preferable to form the heat conductive grease on at least the entire back surface of the second conductive plate 23. In order to improve the heat dissipation performance, it is more preferable to form the heat conductive grease on the entire back surface of the resin sealed body including the exposed surface of the second conductive plate 23. Alternatively, a layer of the heat conductive grease 8 may be formed at a predetermined location of the cooler 9 by using a mask or the like, and the resin sealed body 10 may be arranged and fastened. The mask may be a metal mask or the like provided with a plurality of circular or polygonal openings. The film thickness when the heat conductive grease is applied can be about 70 to 150 μm. The film thickness at the time of application can be adjusted by the thickness of the mask. After coating, the film thickness after fastening the cooler 9 to the resin sealed body 10 with the fastening member can be about 35 to 75 μm. From the viewpoint of thermal resistance, it is more preferably about 35 to 50 μm. If the film thickness is thinner than 35 μm, the film thickness may not be uniform, and there is a possibility that a portion where grease does not exist may be formed.

According to the method for manufacturing a semiconductor device according to the present embodiment, the heat conductive grease can be easily selected without going through the power cycle test of the prior art, and using the selected heat conductive grease, a highly reliable semiconductor device can be manufactured.

WORKING EXAMPLES

Hereinafter, the present invention will be described in more detail with reference to working examples of the present invention. However, the present invention is not limited to the following examples.

<Selection of Candidate Thermal Greases>

Five types of commercially available heat conductive greases were selected as candidate heat conductive greases. Table 1 shows the specifications of the candidate heat conductive grease.

TABLE 1

| | Thermal grease | | | | |
|---|---|---|---|---|---|
| | Grease 1 | Grease 2 | Grease 3 | Grease 4 | Grease 5 |
| Manufacturer | Momentive | Shinetsu Silicone | Momentive | Shinetsu Silicone | Toray Dow Chemical |
| Model number | TIG300BX | G775 | TIG2000 | G791 | TC5622 |
| Remarks | Silicone type | Silicone type | Silicone type | Silicone type | Silicone type |

<Evaluation of Thermal Resistance and Pump-Out of Power Module>

The pump-out resistance of the heat conductive grease in the actual operation of the power module was evaluated. These five types of heat conductive greases, which are candidates, were mounted on the resin sealed body shown in FIG. 1 to manufacture respective power modules. In the power module, the value of the longitudinal dimension/lateral dimension of the sealed body was 2.6. A ΔTj power cycle test was carried out on these power modules with an ON time of 1 second and an OFF time of 2 seconds. Table 2 shows the conditions of the ΔTj power cycle test and the thermal resistance increase rate ΔRj (%) before and after the test. For the thermal resistance measurement, the temperature change ΔTj before and after the test was evaluated from the ΔTj power cycle device, and the thermal resistance was calculated by dividing it by the power consumption.

TABLE 2

| | Thermal grease | | | | |
|---|---|---|---|---|---|
| | Grease 1 | Grease 2 | Grease 3 | Grease 4 | Grease 5 |
| Thermal resistance increase ΔRj (%) | 0 | 0 | 7.5 | 13.2 | 7 |
| Tj max | 150° C. | 150° C. | 150° C. | 150° C. | 150° C. |
| ΔTj | 100° C. | 100° C. | 100° C. | 100° C. | 100° C. |
| Number of cycles | 20000 | 20000 | 20000 | 20000 | 20000 |

Figure 2:
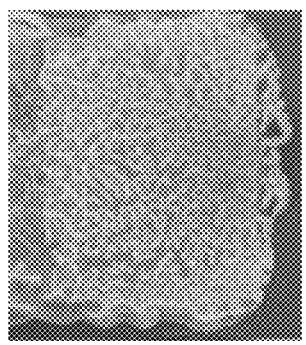
FIG. 2 is a photograph of the back surface of the conductive plate after the power cycle test was performed on the power module manufactured by using the grease example 1.
Figure 3:
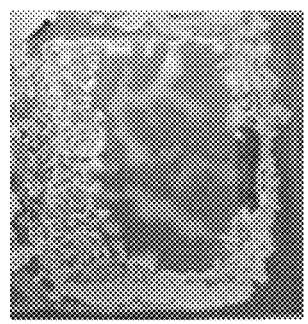
FIG. 3 is a photograph of the back surface of the conductive plate after the power cycle test was performed on the power module manufactured by using the grease example 3.

The resin sealed body after the power cycle test was peeled off from the cooler, and the conductive plate on the back surface was observed. FIG. 2 is a photograph of the back surface of a conductive plate after a power cycle test is performed on the power module manufactured by using grease 1, and FIG. 3 is a photograph of the back surface of a conductive plate after a power cycle test is performed on the power module manufactured by using grease 3. In FIG. 2, it was visually recognized that the grease 1 was held on the conductive plate without significantly changing from the initial mounting state (not shown). In FIG. 2, white and gray mottled grease is formed on the entire surface. On the other hand, in FIG. 3, it was confirmed that the grease 3 did not remain on the conductive plate and was depleted (pumped out). In FIG. 3, the grease has fallen off except for the left end portion. Although not shown, similar photographs were taken for greases 2, 4, and 5. Grease 2 had almost the same result as grease 1. It was confirmed that the greases 4 and 5 were pumped out in the same manner as the grease 3. From the above, it is considered that the main cause of the increase in thermal resistance ΔRj shown in Table 2 is the pump-out of the heat conductive grease caused by the warp deformation of the module.

<Evaluation of Viscoelasticity of Heat Conductive Grease>

For the five types of heat conductive grease, an attempt was made to identify the heat conductive grease(s) having a high pump-out suppressing effect based on the shear stress-strain curve measured by the vibration rheometer and the value of the share stress at which the storage elastic modulus G' became equal to the loss elastic modulus G" (tan δ=1), which was obtained by sweeping the shear stress. As the measurement conditions of the rheometer, the actual usage condition of the power module was assumed, and therefore, the measurement was performed under the conditions of the measurement temperatures T of 25° C., 125° C., and 175° C., respectively. As the vibration rheometer, Physica MCR301 manufactured by Antonio Par Co., Ltd. was used, the frequency at which strain was applied was 1 Hz, and the indentation thickness was all 500 μm.

Figure 4:
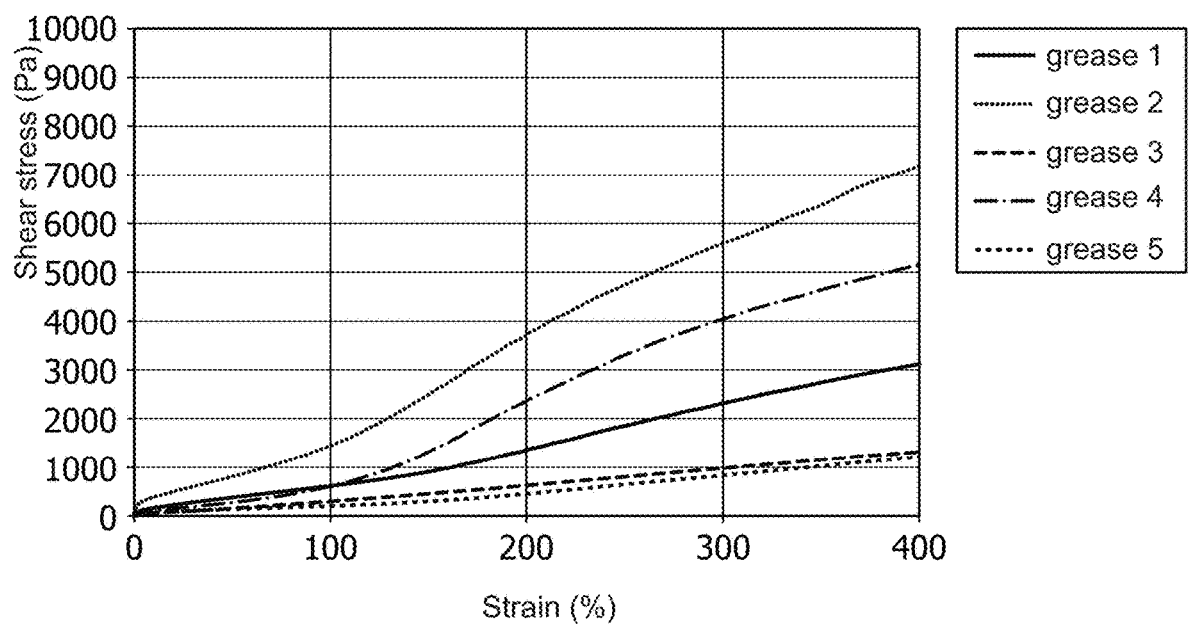
FIG. 4 is a shear stress-strain curve of five types of heat conductive grease at 25° C.
Figure 5:
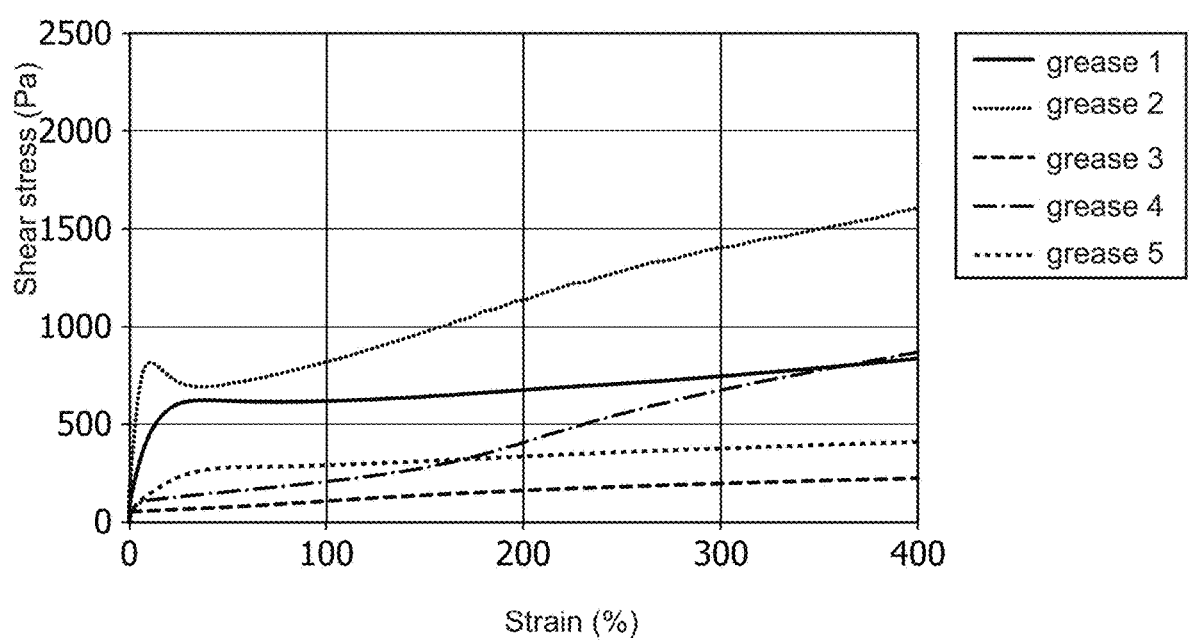
FIG. 5 is a shear stress-strain curve of five types of heat conductive grease at 125° C.
Figure 6:
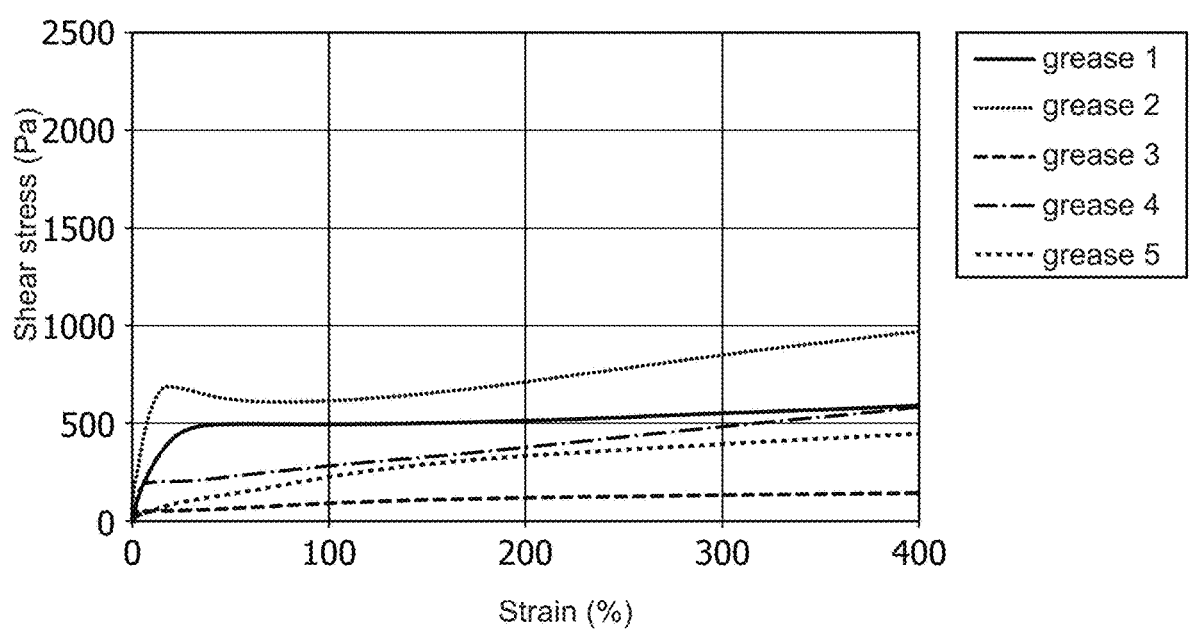
FIG. 6 is a shear stress-strain curve of five types of heat conductive grease at 175° C.
Figure 7:
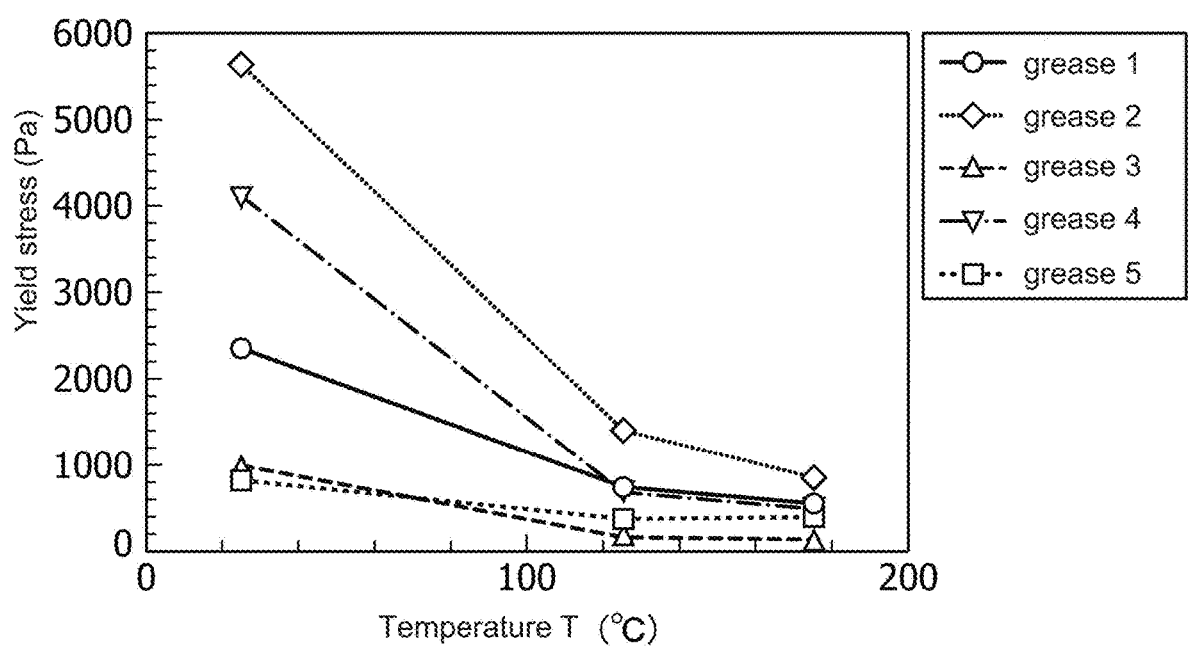
FIG. 7 is a graph in which the shear stress (yield stress) when the strain is 300% in each graph of FIGS. 4 to 6 is plotted with the horizontal axis as the temperature.

FIG. 4 is a shear stress-strain curve measured for the five types of heat conductive grease at 25° C., FIG. 5 shows the same measurements at 125° C., and FIG. 6 shows the same measurements at 175° C. FIG. 7 is a graph in which the shear stress (yield stress) when the strain is 300% in each graph of FIGS. 4 to 6 is plotted with the horizontal axis as the temperature. From the shear stress-strain curve, it was initially considered that the heat conductive grease with a small strain with respect to a constant shear stress would not be easily pushed out of the power module, so that the pump-out suppressing effect would be high. However, no clear correlation was found between the shear stress-strain curve with respect to various temperatures and the thermal resistance increase ΔRj of each heat conductive grease, and therefore, it was found that the pump-out suppression effect cannot be discerned from these shear stress-strain curves only.

Figure 8:
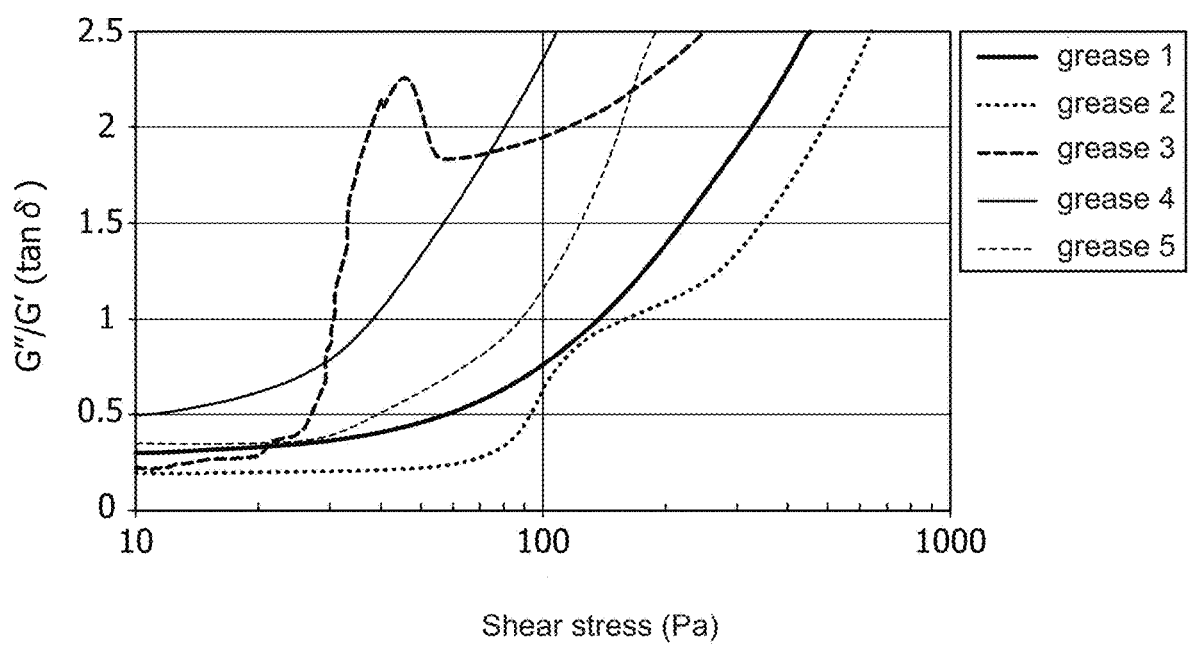
FIG. 8 is a graph showing the ratio (tan $\delta_T$) of the storage elastic modulus $G_T'$ and the loss elastic modulus $G_T''$ obtained when the shear stress is swept at T=25° C. for five types of heat conductive greases.
Figure 9:
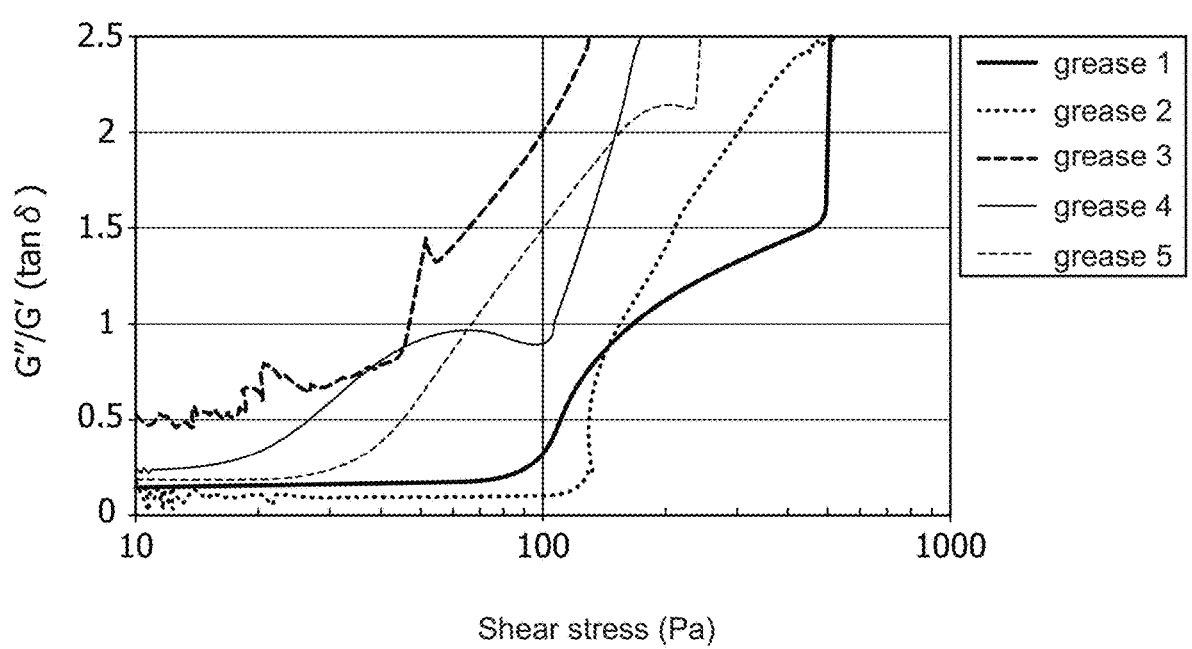
FIG. 9 is a graph showing the ratio (tan $\delta_T$) of the storage elastic modulus $G_T'$ and the loss elastic modulus $G_T''$ obtained when the shear stress is swept at T=125° C. for five types of heat conductive greases.
Figure 10:
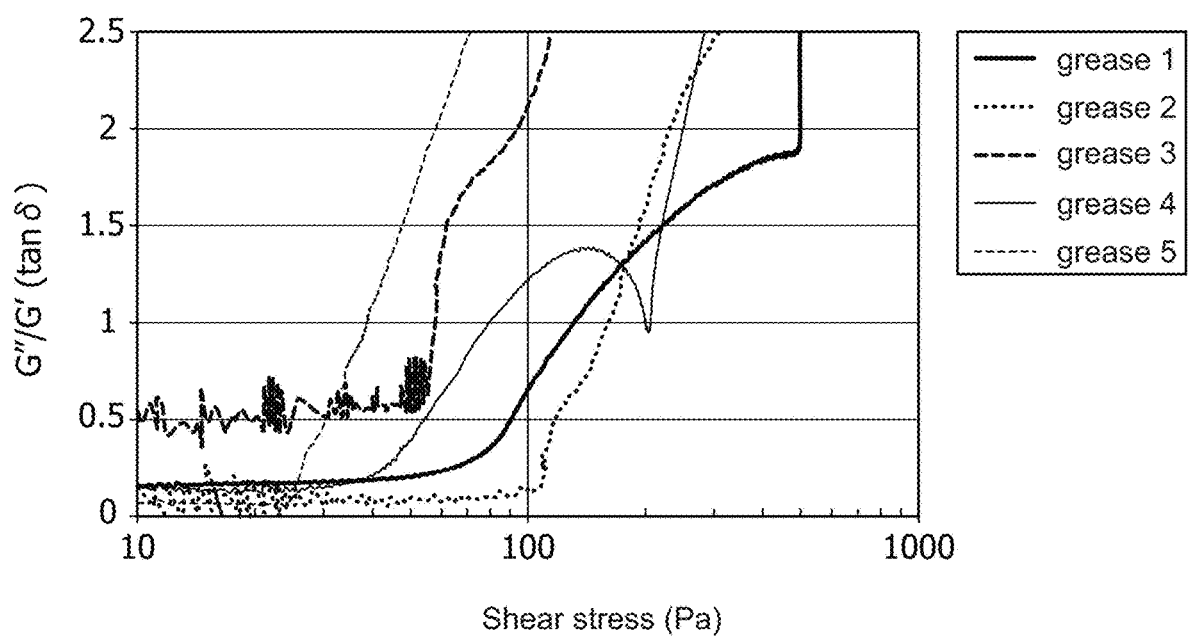
FIG. 10 is a graph showing the ratio (tan $\delta_T$) of the storage elastic modulus $G_T'$ and the loss elastic modulus $G_T''$ obtained when the shear stress is swept at T=175° C. for five types of heat conductive greases.
Figure 11:
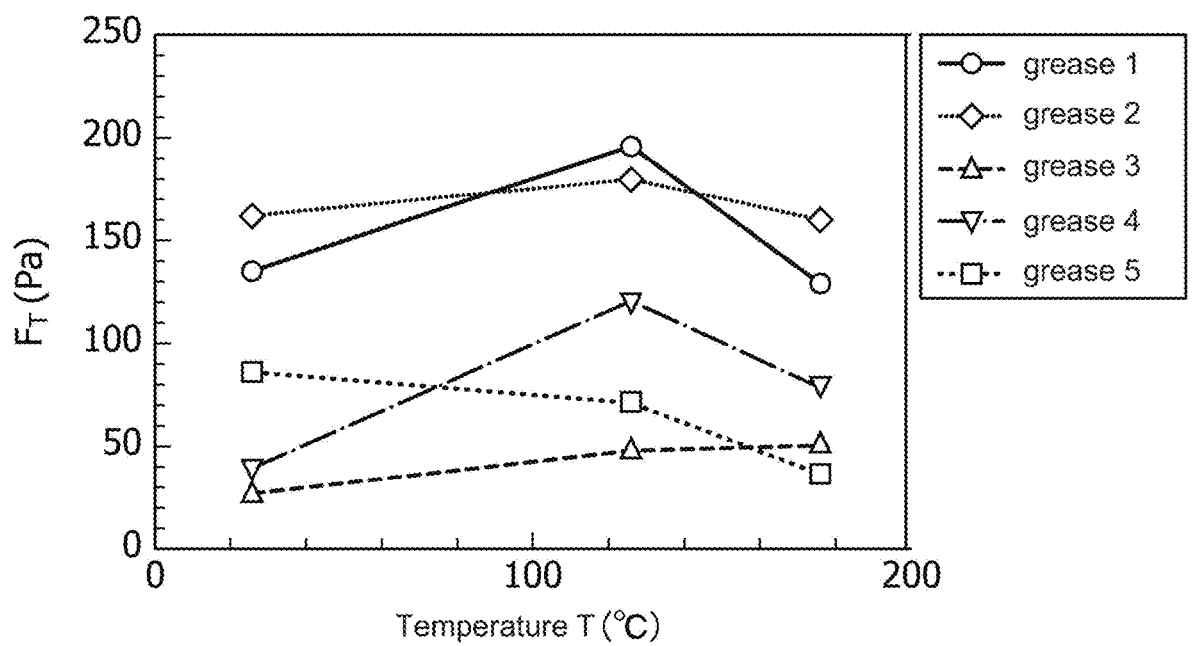
FIG. 11 is a graph in which $F_T$s obtained from FIGS. 8 to 10 are plotted against temperatures T (25° C., 125° C., 175° C.) for five types of heat conductive greases.

Next, the value $F_T$ of the shear stress at which the storage elastic modulus G' and the loss elastic modulus G" match obtained by sweeping the shear stress was evaluated. FIG. 8 shows the ratio (tan $δ_T$) of a storage elastic modulus $G_T'$ and a loss elastic modulus $G_T''$ obtained when shear stress is swept for each grease at T=25° C. FIG. 9 shows the same measurements at T=125° C., and FIG. 10 shows the same measurements at T=175° C. FIG. 11 is a graph in which $F_T$'s obtained from FIGS. 8 to 10 are plotted against the temperatures T (25° C., 125° C., 175° C.). Table 3 shows the measured values of $F_T$ at each temperature T.

TABLE 3

|  |  | Grease 1 | Grease 2 | Grease 3 | Grease 4 | Grease 5 |
|---|---|---|---|---|---|---|
| $F_T$ (Pa) | T = 25 (° C.) | 137 | 164 | 30 | 40 | 88 |
|  | T = 125 (° C.) | 198 | 182 | 51.4 | 121 | 73.5 |
|  | T = 175 (° C.) | 131 | 162 | 54.2 | 80.3 | 38.4 |

As shown in FIG. 11, for greases 1 and 2 in which the thermal resistance did not increase in the ΔTj power cycle test, in the temperature range of room temperature (25° C.) to 175° C., which is the operating temperature of a typical power module, the $F_T$ was between 100 Pa and 200 Pa. It was also found that the $F_T$ had a maximum value in the temperature range of 100° C. to 175° C. A large $F_T$ is considered to mean that a large force is required for the heat conductive grease to flow, and as a result, it is assumed that a high pump-out suppressing effect can be obtained. The heat conductive grease having an $F_T$ of more than 200 Pa is difficult to apply in the manufacture of a semiconductor device, and is not suitable from the viewpoint of workability.

From the above examination, by evaluating the yield value by the above method, it was possible to identify the heat conductive grease having a high pump-out suppressing effect.

<Correlation Between Viscosity at Room Temperature and Pump-Out Characteristics>

The shear viscosity of the five types of heat conductive grease at room temperature was evaluated by vibration rheometer measurement. The shear viscosity was plotted against the shear rate, and the shear viscosities of Grease 1 to Grease 5 were obtained at a shear rate of 50 sec$^{-1}$ at which the shear viscosity had a stable value. The results are shown in Table 4.

TABLE 4

|  | Thermal grease | | | | |
|---|---|---|---|---|---|
|  | Grease 1 | Grease 2 | Grease 3 | Grease 4 | Grease 5 |
| Shear viscosity (Pa) | 94.6 | 162 | 39.6 | 132 | 44.5 |

Table 4 shows that there is no correlation between viscosity at room temperature and pump-out characteristics.

<Thermal Stability of Heat Conductive Grease>

Figure 12:
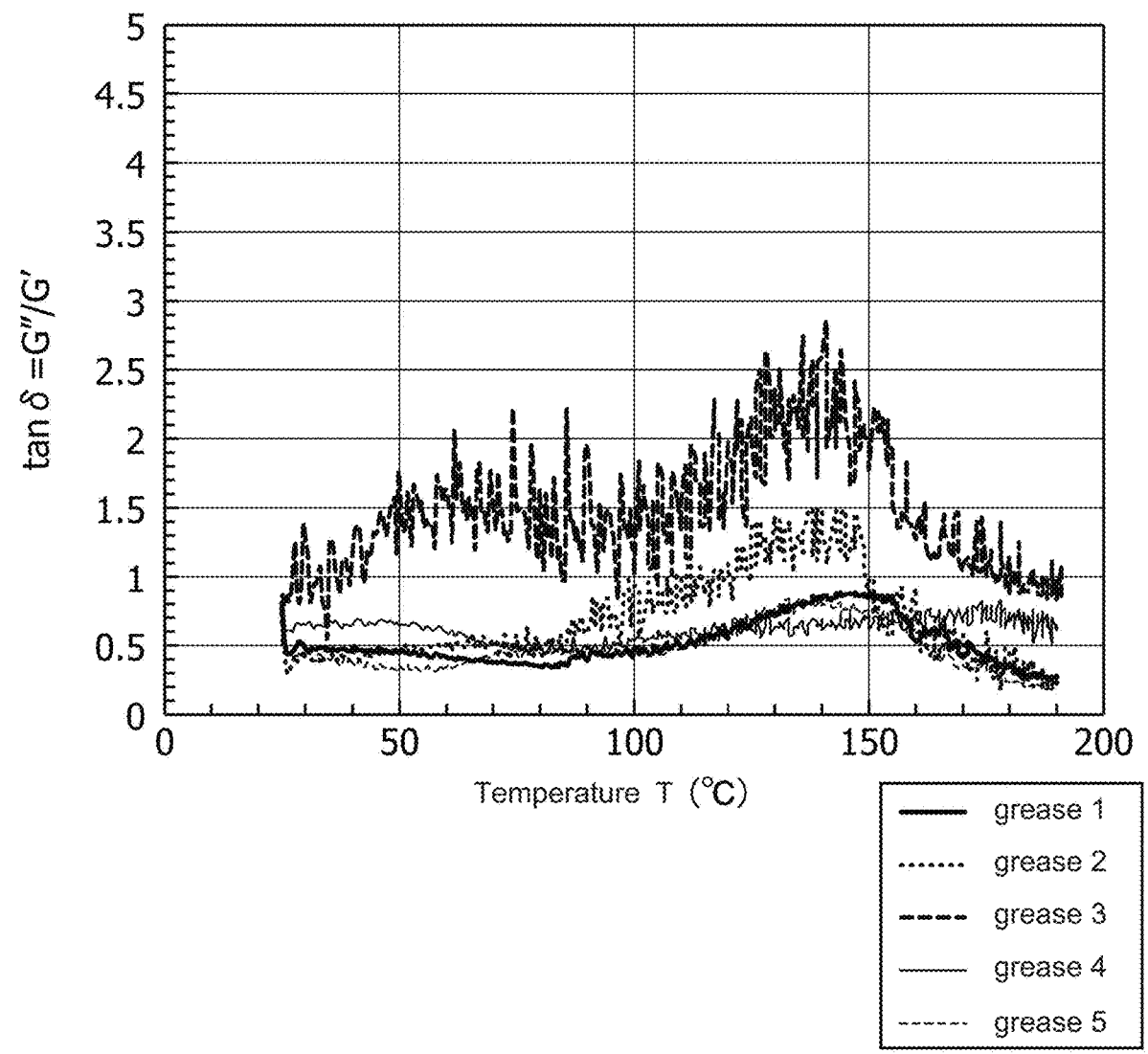
FIG. 12 is a graph in which the ratio (tan $\delta_T$) of the storage elastic modulus $G_T'$ and the loss elastic modulus $G_T''$ is plotted with respect to the temperature T for five types of heat conductive greases.

The temperature characteristics of tan δ were investigated in order to evaluate the stability of the five types of heat conductive grease with respect to temperature. A graph in which the value of tan $δ_T$ is plotted against the temperature T is shown in FIG. 12. The plot result shows the stability of the heat conductive greases with respect to temperature. As shown in FIG. 12 and Table 5 below, it was found that the maximum values of tan $δ_T$ and the fluctuation range of greases 1, 2, 4, and 5 were small.

TABLE 5

|  | Grease 1 | Grease 2 | Grease 3 | Grease 4 | Grease 5 |
|---|---|---|---|---|---|
| Temperature characteristics of tan$δ_T$ (maximum value/fluctuation range) | 0.8/0.6 | 1.5/1.3 | 2.4/2 | 0.8/0.3 | 0.8/0.6 |

<Heat Resistance of Heat Conductive Grease>

In selecting the heat conductive grease, it is necessary that the weight loss is small; that is, there is little deterioration at a temperature higher than 100° C. which is within the actual operating temperature of the power module, thereby having a high heat resistant temperature. The heat resistant temperature was evaluated by thermogravimetric analysis. The measurement conditions for thermogravimetric analysis were an atmospheric atmosphere, a temperature range of 30° C. to 800° C., and a heating rate of 20° C./min.

Table 6 shows the heat resistant temperature (1% weight loss temperature of oil) of the heat conductive grease evaluated in the present invention obtained from thermogravimetric analysis.

TABLE 6

| | Thermal grease | | | | |
|---|---|---|---|---|---|
| | Grease 1 | Grease 2 | Grease 3 | Grease 4 | Grease 5 |
| Heat-resistant temperature (° C.) | 243 | 202 | 279 | 261 | 278 |

The heat resistant temperature of the heat conductive grease is assumed to be the volatilization temperature of oil, which is one of the components contained in the heat conductive grease. Here, the 1% weight loss temperature of the oil was evaluated as the heat resistant temperature as a criterion for selecting the heat conductive grease. The 1% weight loss temperature of the oil is calculated by the following method. Since the filler contained in the heat conductive grease does not thermally decompose in the temperature range of 30° C. to 800° C., which is the measurement temperature range of thermogravimetric analysis, it can be considered that the weight loss corresponds to the ratio of the oil component. Therefore, the proportion of the oil component in the heat conductive grease corresponds to the value obtained by subtracting the minimum value of the weight percent from the total weight of 100%. The ratio of this oil component is converted as 100%, and the 1% weight loss temperature of the oil is calculated from the 1% weight loss temperature. In the present invention, this temperature is defined as the heat resistant temperature of the heat conductive grease. Greases 1 and 2 with less pump-out also had good heat resistance.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method for manufacturing a semiconductor device, comprising:
   preparing a plurality of candidate heat conductive greases;
   for each of the plurality of candidate heat conductive greases, at each of a plurality of prescribed temperatures, measuring a storage elastic modulus and a loss elastic modulus when shear stress is swept;
   for each of the plurality of candidate heat conductive greases, at each of the plurality of prescribed temperatures, determining a value $F_T$ of shear stress at which a value obtained by dividing the measured loss elastic modulus by the measured storage elastic modulus equals 1;
   selecting a heat conductive grease, among the plurality of candidate heat conductive greases, that has a value of $F_T$ of 100 Pa or more and 200 Pa or less at each of the plurality of the prescribed temperatures; and
   attaching a resin sealed body that includes a semiconductor element mounted on a laminated substrate therein to a cooler via the heat conductive grease that has been selected in the selecting.

2. The method of claim 1, wherein the plurality of prescribed temperatures are in a range from 25° C. to 175° C.

3. The method according to claim 1, wherein the measuring of the storage elastic modulus and the loss elastic modulus when shear stress is swept is performed by vibration rheometer measurement.

4. The method according to claim 1, wherein the resin sealed body has a ratio of a longitudinal dimension to a lateral dimension of 1.5 or more.

5. The method according to claim 1, wherein the semiconductor element is made of Si or SiC.

* * * * *